(12) United States Patent
Lin

(10) Patent No.: US 7,993,152 B2
(45) Date of Patent: Aug. 9, 2011

(54) ELECTRICAL CONNECTOR HAVING IMPROVED RESTRICTING PORTIONS

(75) Inventor: Wei-Chih Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/750,599

(22) Filed: Mar. 30, 2010

(65) Prior Publication Data

US 2010/0248519 A1    Sep. 30, 2010

(30) Foreign Application Priority Data

Mar. 31, 2009    (TW) .............................. 98205043 U

(51) Int. Cl.
*H01R 11/22* (2006.01)
(52) U.S. Cl. ......................................... 439/266; 439/72
(58) Field of Classification Search .................. 439/266, 439/72, 269.1
See application file for complete search history.

(56) References Cited

U.S. PATENT DOCUMENTS

| | | | | |
|---|---|---|---|---|
| 5,490,795 A | * | 2/1996 | Hetzel et al. | 439/266 |
| 5,700,155 A | * | 12/1997 | Matsuoka | 439/266 |
| 5,908,324 A | * | 6/1999 | Ohshima et al. | 439/266 |
| 7,121,858 B2 | | 10/2006 | Chen | |
| 7,857,646 B2 | * | 12/2010 | Stutzman et al. | 439/266 |
| 2003/0045148 A1 | * | 3/2003 | Watanabe | 439/266 |

* cited by examiner

*Primary Examiner* — Hien Vu
(74) *Attorney, Agent, or Firm* — Ming Chieh Chang; Wei Te Chung; Andrew C. Cheng

(57) ABSTRACT

An electrical connector (100) electrically connects a chip of a first width. The electrical connector includes an insulative housing (2), a number of contacts (3), a connecting member (4), and an actuator (5) mounted on the insulative housing. The connecting member has a connecting region electrically connectable with the chip. The connecting region has a second width not less than the first width. The actuator is formed with a pair of first side walls (51) and a pair of restricting portions (514) respectively protruding inwardly from the pair of first side walls. The pair of restricting portions are spaced a distance substantially equal to the second width to guidingly restrict the chip in the connecting region.

12 Claims, 6 Drawing Sheets

ELECTRICAL CONNECTOR HAVING IMPROVED RESTRICTING PORTIONS

BACKGROUND OF THE INVENTION

1. Field of the Invention

The present invention relates to an electrical connector, and more particularly to a test socket having restricting portions restricting the chips at the predetermined position.

2. Description of Related Art

U.S. Pat. No. 7,121,858 issued to Chen on Oct. 17, 2006 discloses an electrical connector. The electrical connector comprises an insulative housing, a connecting member and an actuator mounted on the insulative housing, and a pair of springs mounted between the actuator and the insulative housing. The connecting member has a connecting region connectable with the chip. During the insertion process, when the actuator is pushed downwardly, the chip is located on the connecting region.

A locating space surrounded by the inner faces of the actuator is larger than the connecting region. During the insertion process, the chip is apt to be located at an undesired position out of the connecting region. It would result in unreliable connection between the chip and the electrical connector.

Hence, an electrical connector formed with an improved restricting portion is desired to overcome the above-mentioned disadvantages of the related art.

SUMMARY OF THE INVENTION

An object of the present invention is to provide a burn-in test socket having improved restricting portions restricting the chip at a predetermined position.

To achieve the aforementioned objects, an electrical connector electrically connecting a chip of a first width includes an insulative housing defining a plurality of contact recesses, a plurality of contacts inserted in the contact recesses, a connecting member and an actuator. The connecting member is mounted on the insulative housing and has a connecting region electrically connectable with the chip. The connecting region has a second width not less than the first width. The actuator is moveably assembled to the insulative housing. The actuator is formed with a pair of first side walls and a pair of restricting portions respectively protruding inwardly from the pair of first side walls. The pair of restricting portions are spaced a distance substantially equal to the second width to guidingly restrict the chip in the connecting region.

The electrical connector could be connected with two types of IC package having different widths, in a condition that the guiding members are assembled to or disassembled from the connecting member. The guiding members could be designed into different dimensions to guide in different types of IC package.

Other objects, advantages and novel features of the invention will become more apparent from the following detailed description of a preferred embodiment when taken in conjunction with the accompanying drawings.

DETAILED DESCRIPTION OF THE INVENTION

Figure 1:
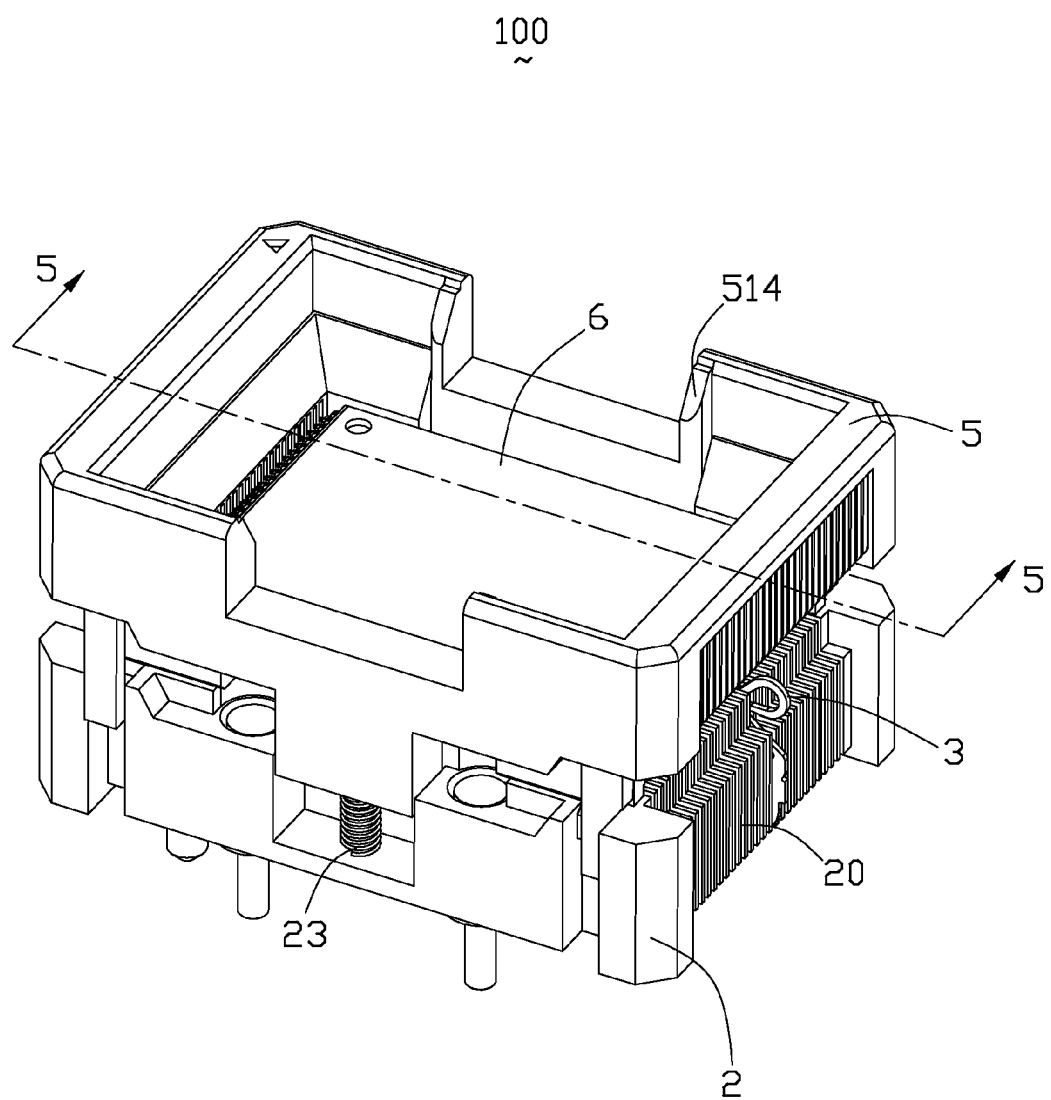
FIG. 1 is an assembled perspective view showing an electrical connector in an initial position in accordance with the present invention.

Reference will now be made to the drawing figures to describe the present invention in detail. Referring to FIGS. 1-5, an electrical connector 100 in accordance with the preferred embodiment of the present invention is adapted for electrically connecting with a chip 6. The chip 6 is formed with a plurality of conductive tails 61. The electrical connector 100 comprises an insulative housing 2, a plurality of contacts 3, a pair of springs 23, a connecting member 4 and an actuator 5.

Figure 2:
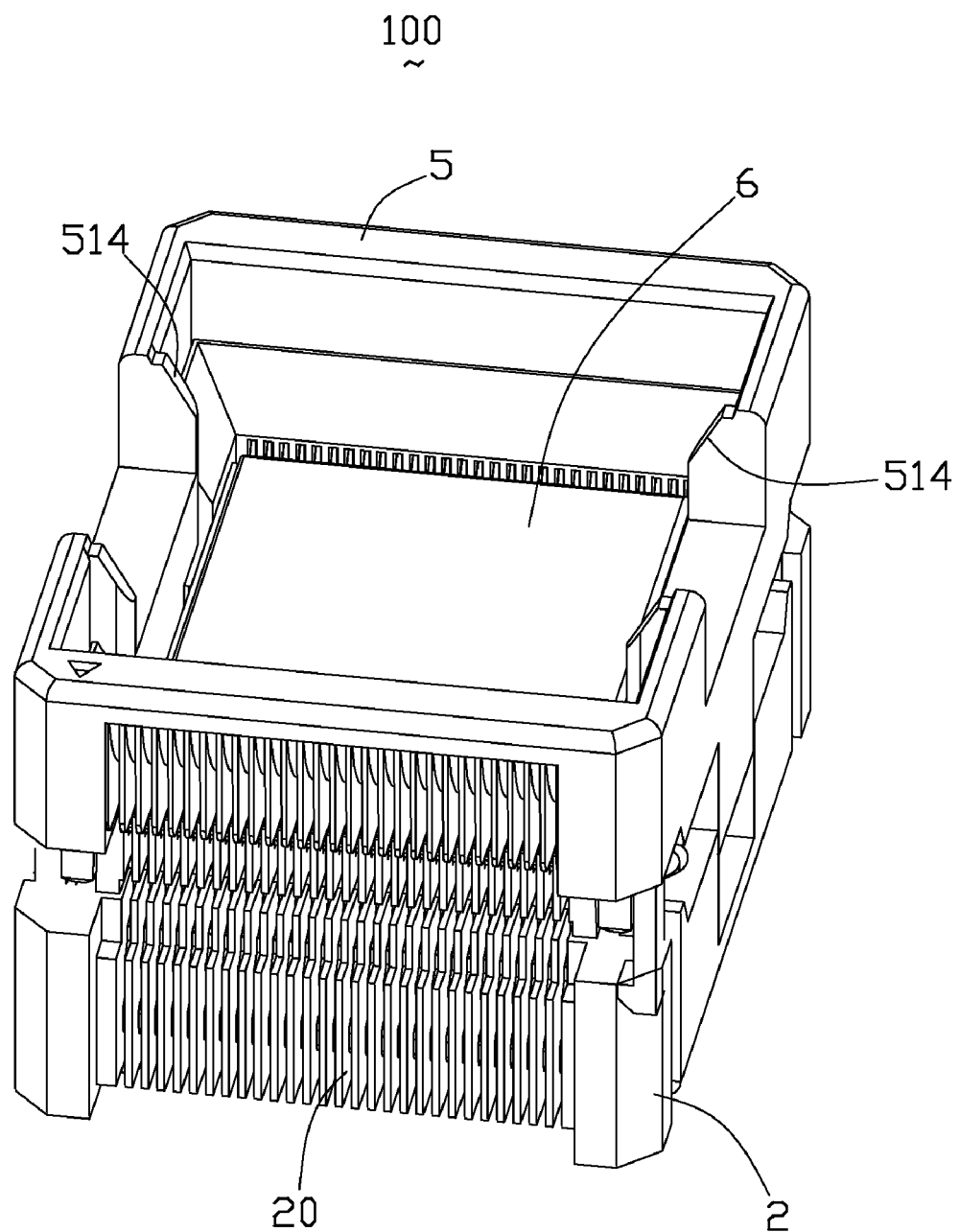
FIG. 2 is an assembled perspective view similar to FIG. 1, taken from another aspect.
Figure 3:
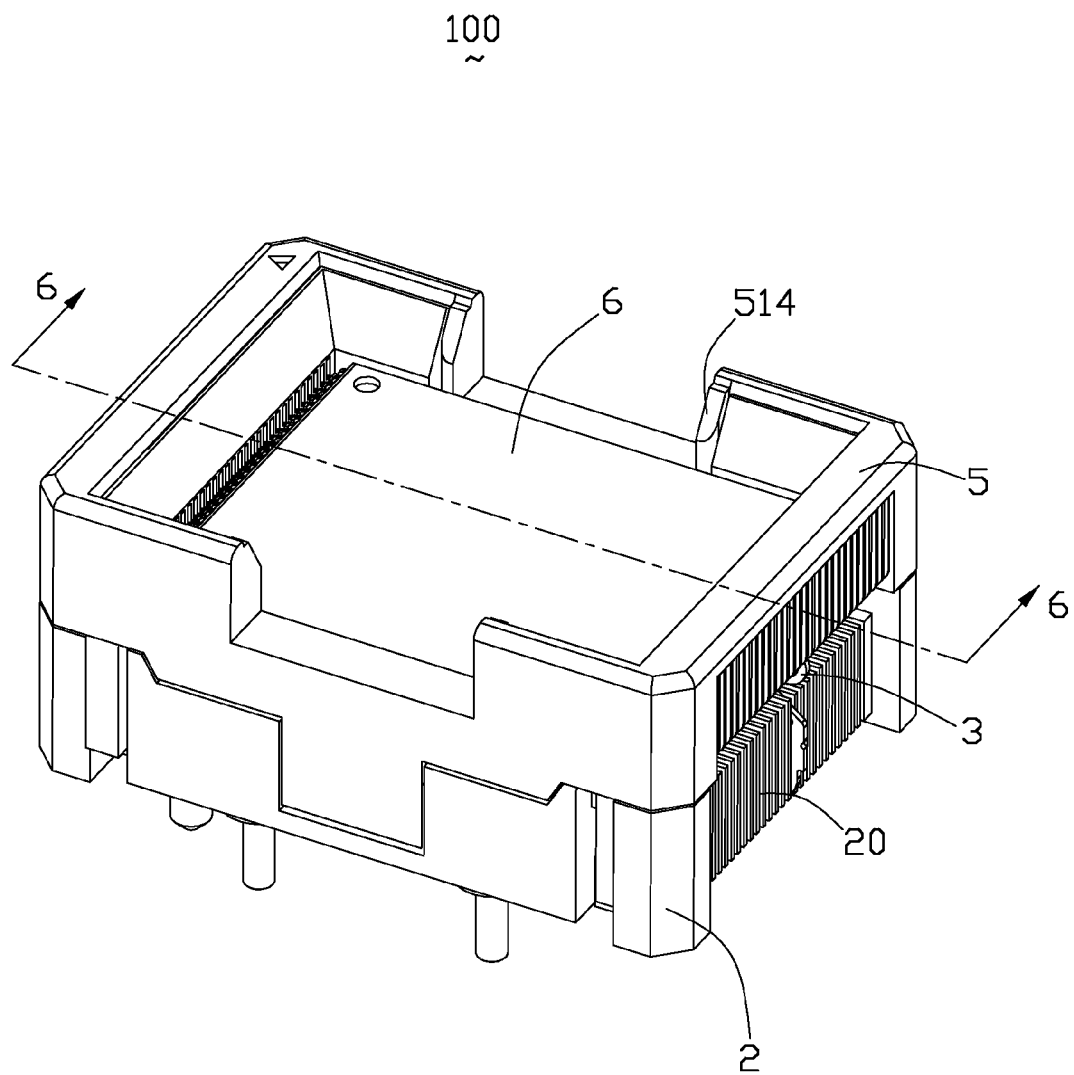
FIG. 3 is an assembled perspective view showing the electrical connector in a depressed position.

Referring to FIGS. 2 and 3, the insulative housing 2 comprises a base 27 having a pair of first side faces 271 and a pair of second side faces 272. The base 27 defines a plurality of latching recesses 21 and a plurality of through holes 24 at the outer side of the latching recesses 21. The insulative housing 2 defines a plurality of contact recesses 20 at the first side faces 271 for insertion of the contacts 3. The insulative housing 2 defines a plurality of sliding recesses 25 at the second side faces 272. Each sliding recess 25 has a blocking portion 26 formed therein. The insulative housing 2 has an opening 28 defined on each second side face 272 between two sliding recesses 25. The opening 28 is formed with an upwardly extending protrusion 22.

The contact 3 comprises a body portion 30, a soldering portion 32 formed at the bottom of the body portion 30, a first and a second beams 33, 34 extending from the body portion 30. The second beam 34 is located above the first beam 33 and comprises a first branch 341 and a second branch 342. The second branch 342 is located between the first branch 341 and the first beam 33.

The connecting member 4 comprises a connecting wall 40, a pair of primary walls 41 rising from opposite sides of the connecting wall 40, and a plurality of periphery walls 42 rising from the connecting wall 40. Each periphery wall 42 is connected to a respective side edge of the primary wall 41. The connecting member 4 has a plurality of latching beams 43 extending downwardly from the connecting wall 40. The connecting wall 40 has a plurality of slits 401 communicating with the contact recesses 20 defined adjacent to the primary walls 41 for corresponding to the contacts 3. The periphery wall 42 defines a cutout 45 therein. The periphery wall 42 comprises a vertical first inner face 421 and an inclined face 422 extending from the first inner face 421.

The actuator 5 comprises a pair of first side walls 51 and a pair of second side walls 52 connected together. The first side wall 51 is formed with a restricting portion 514 protruding inwardly from the first side wall 51. The restricting portion 514 is formed with a pair of guiding faces 5141 and a second inner face 5142 below the guiding face 5141. The second side wall 52 defines a plurality of contact slots 50 communicating with corresponding contact recesses 20 of the insulative housing 2. The actuator 5 is formed with a plurality of downwardly extending sliding beams 53.

Figure 4:
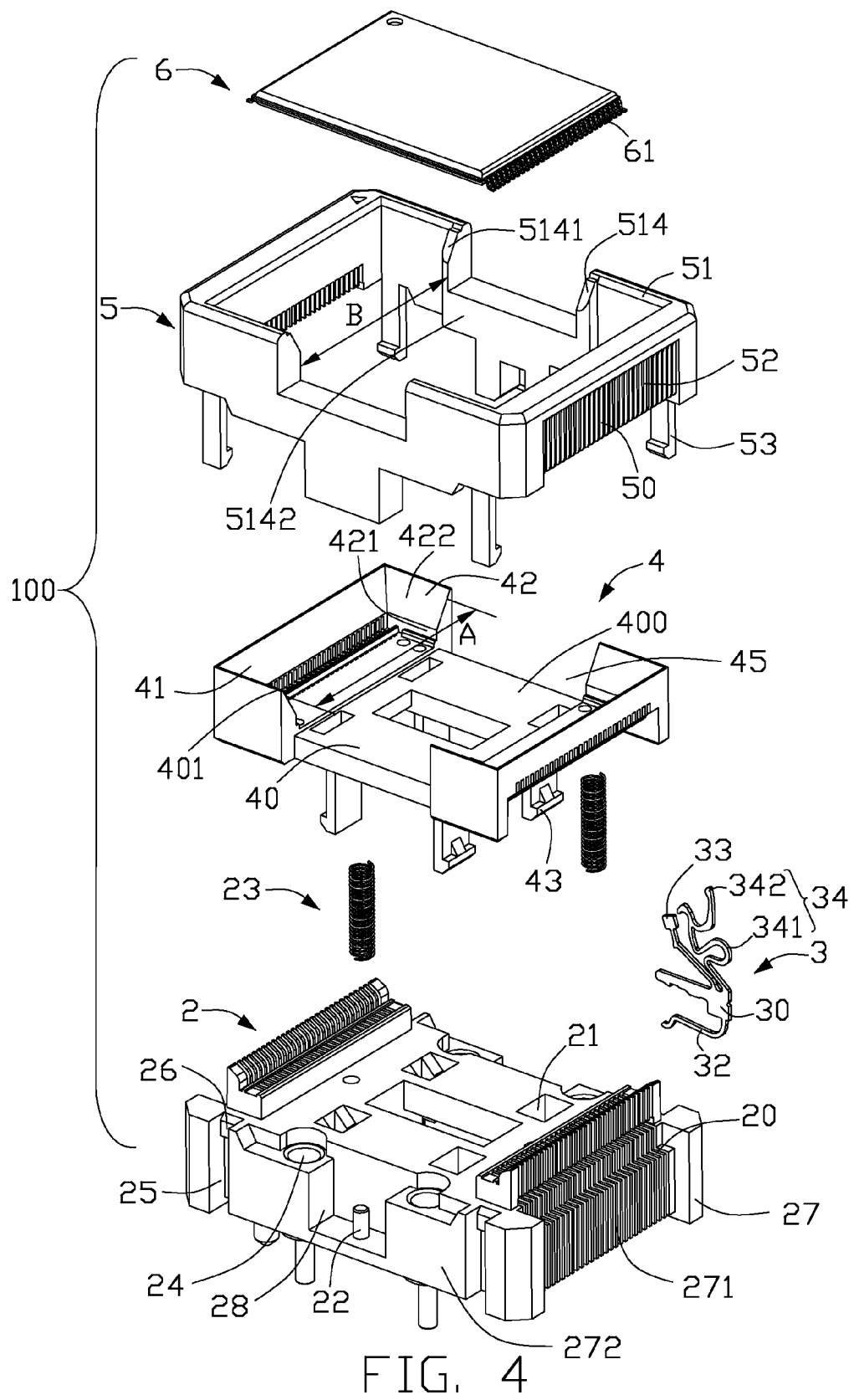
FIG. 4 is an exploded perspective view of the electrical connector as shown in FIG. 1.
Figure 5:
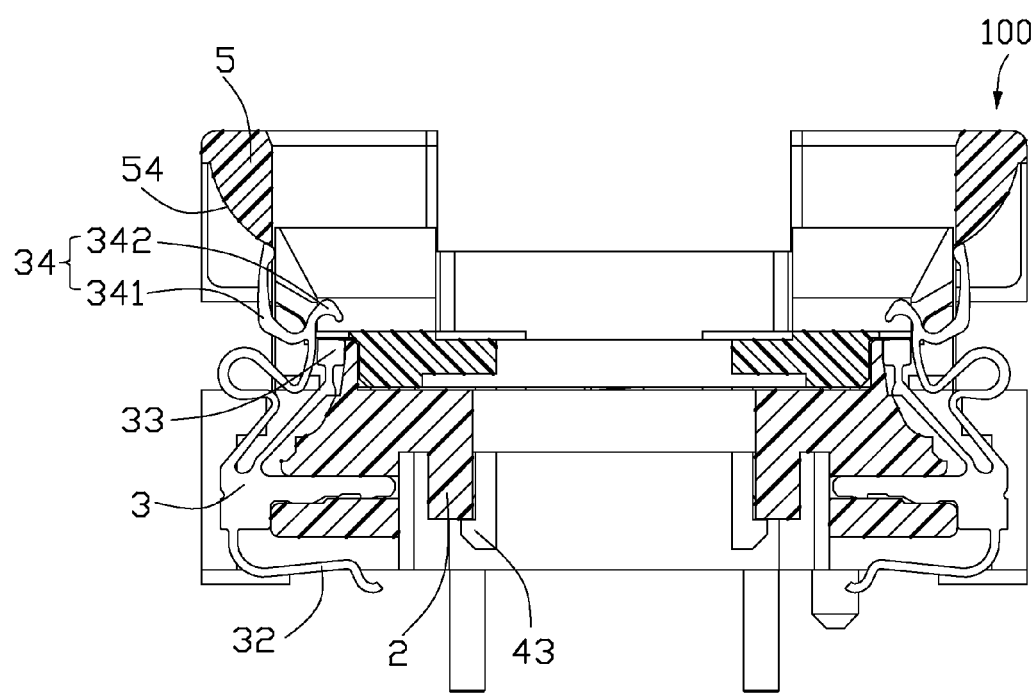
FIG. 5 is a cross-sectional view of the electrical connector, taken along line 5-5 of FIG. 1, when the electrical connector is located in a closed position, with the IC package being left out.

Referring to FIGS. 1 and 5, in assembling of the electrical connector 100, the contacts 3 are inserted in the contact recesses 20, and the springs 23 are encircled around the protrusions 22. The connecting member 4 is mounted on the insulative housing 2, with the latching beams 43 latching with the latching recesses 21. The actuator 5 is floatably mounted on the insulative housing 2 and supported by the springs 23, with the sliding beams 53 slidable in the sliding recesses 25. The restricting portions 514 are disposed in the cutouts 45. The second inner face 5142 of the actuator 5 is coplanar with corresponding first inner face 421 of the connecting member 4. In conjunction with FIG. 4, the first branch 341 of the contact 3 is secured in the contact slot 50 of the actuator 5.

Figure 6:
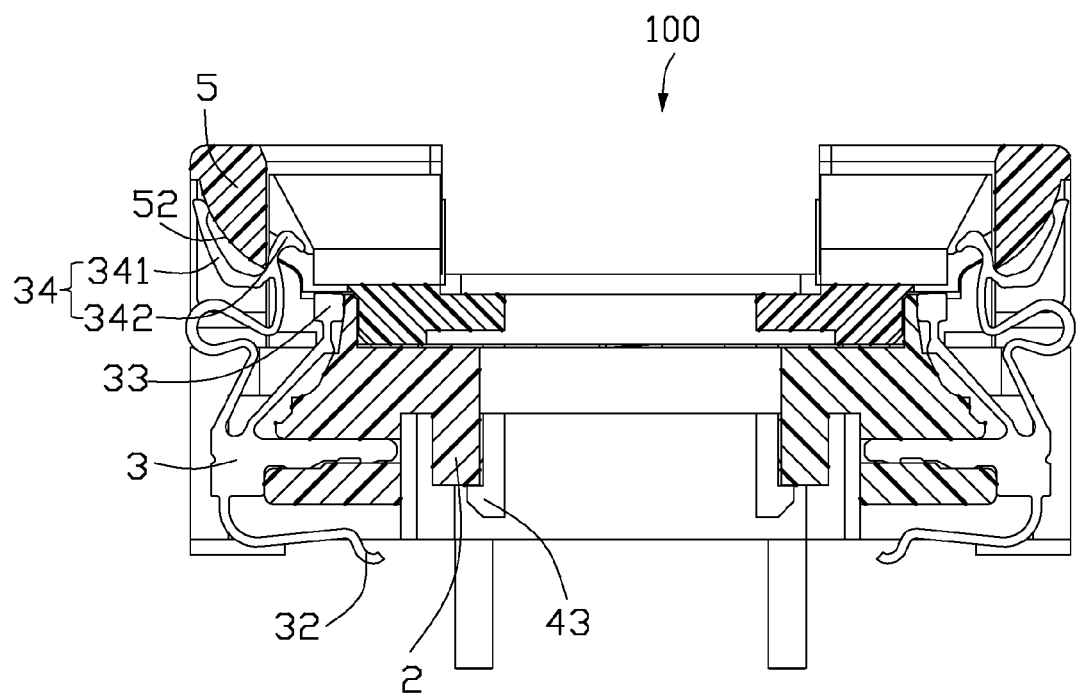
FIG. 6 is a cross-sectional view of the electrical connector, taken along line 6-6 of FIG. 3, when the electrical connector is located in an opened position, with the IC package being left out.

FIGS. 3 and 6 show the depressed electrical connector 100. When the actuator 5 is actuated downwardly, the first branches 341 of the contacts 3 are depressed by the actuator 5 and slide along an oblique face 54 of the actuator 5 to an opened position as shown in FIG. 5. The chip 6 is put into the connecting member 4.

FIGS. 1 and 5 show the initial electrical connector 100, i.e., the restored electrical connector 100. When the actuator 5 is released, the actuator 5 restores to the initial position as shown in FIG. 4, under the resilient force provided by the springs 23. The second branch 342 and the first beam 33 clamp and electrically connect with the conductive tails 61 of the chip 6. The sliding beams 53 of the actuator 5 slide along the sliding recesses 25 and are blocked by the blocking portions 26.

Referring to FIG. 4, a locating region of the connecting wall 40 has a width A between the pair of inclined faces 422 of the periphery walls 42 of the connecting member 4. An effective connecting region has a width B between the pair of first inner faces 421 of the periphery walls 42. The width B is smaller than the width A. A distance between the second inner faces 5142 of the pair of restricting portions 514 is equal to the width B. It is possible that the chip 6 is disdodged at an undesired position of the locating region, i.e., not in the connecting region. However, during the restoring process, when the chip 6 is located at the undesired position, the chip 6 would be guided by the guiding faces 5141 of the restricting portions 514 of the upwardly restoring actuator 5. The chip 6 would be finally restricted in the connecting region between the pair of restricting portions 514, since the distance between the pair of the second inner faces 5142 of the restricting portions 514 is equal to the width B of the effective connecting region, when the actuator 5 is restored to the initial position.

However, the disclosure is illustrative only, changes may be made in detail, especially in matter of shape, size, and arrangement of parts within the principles of the invention.

What is claimed is:

1. An electrical connector for electrically connecting a chip of a first width, comprising:
   an insulative housing defining a plurality of contact recesses;
   a plurality of contacts inserted in the contact recesses;
   a connecting member mounted on the insulative housing and having a connecting region electrically connectable with the chip, said connecting region having a second width larger than the first width; and
   an actuator moveably assembled to the insulative housing, said actuator being formed with a pair of first side walls having cutout portions and a pair of restricting portions respectively protruding inwardly from the pair of first side walls, the pair of restricting portions being extended along sides of the cutout portions and spaced a distance substantially equal to the second width to guidingly restrict the chip in the connecting region;
   wherein each restricting portion is formed with a guiding face for guiding the chip into the connecting region;
   wherein said connecting member comprises a pair of periphery walls each having a first inner face and an inclined face extending from the first inner face, and said restricting portion has a second inner face substantially coplanar with the first inner face; and
   wherein said insulative housing defines a plurality of sliding recesses and a plurality of blocking portions each formed in an associated sliding recess, and wherein said actuator is formed with a plurality of sliding beams each extended downwardly from a bottom of the actuator and slidable in the sliding recess and blocked by the blocking portion.

2. The electrical connector as claimed in claim 1, wherein each periphery wall of the connecting member defines a cutout corresponding to the restricting portion.

3. The electrical connector as claimed in claim 1, wherein said connecting member comprises a connecting wall, said connecting region being defined on the connecting wall.

4. The electrical connector as claimed in claim 3, wherein said connecting member comprises a pair of primary walls each defining a plurality of slits for insertion of the contacts, said pair of primary walls and the pair of periphery walls rising from the connecting wall.

5. The electrical connector as claimed in claim 3, wherein said insulative housing defines a plurality of latching recesses, said connecting member comprising a plurality of latching beams extending downwardly from the connecting wall for latching with the latching recesses.

6. The electrical connector as claimed in claim 1, further comprising a plurality of springs mounted between the insulative housing and the actuator for supporting the actuator.

7. The electrical connector as claimed in claim 1, wherein said contact comprises a body portion, a first and a second beams extending from the body portion for clamping and electrically connecting with the chip.

8. The electrical connector as claimed in claim 7, wherein said actuator is formed with a plurality of contact slots communicating with the contact recesses, said second beam of the contact comprising a first branch secured in the contact slot.

9. The electrical connector as claimed in claim 8, wherein said second beam of the contact comprises a second branch located between the first branch and the first beam, said first branch being operable by the actuator to urge the second branch and the first beam to engage with or disengage from the chip.

10. An electrical connector for electrically connecting a chip comprising:
    an insulative housing defining a plurality of contact recesses;
    a plurality of contacts disposed in the corresponding contact recesses, respectively;
    a connecting member mounted upon the housing and having a connecting region electrically connectable with the chip and defining a plurality of slits in alignment with the corresponding contact recesses, respectively, to allow the corresponding contacts to extend thereinto;
    an actuator up and down moveably mounted upon the connecting member and defining a plurality of contact slots in alignment with the corresponding contact recesses and slits, respectively;

the connecting member defining a plurality of periphery walls to define an electronic component receiving cavity with a pair of cutouts formed in two opposite side periphery walls;

the actuator including a pair of corresponding side walls having cutout portions and a pair of restricting portions having guiding faces respectively protruding inwardly from the pair of first side walls, the pair of restricting portions being extended along sides of the cutout portions and spaced a distance substantially equal to the second width to guidingly restrict the chip in the connecting region and thereon a pair of protrusions extended downwardly from a bottom of the actuator for receiving in the corresponding cutouts of the connecting member;

wherein each of the periphery walls defines an upper oblique guiding section and a lower vertical section for stationary guidable reception of an electronic component in the electronic component receiving cavity, and each of the protrusions defines an upper oblique guiding portion and lower vertical portion for dynamic guidable reception of the electronic component in the electronic component receiving cavity;

wherein said insulative housing defines a plurality of sliding recesses and a plurality of blocking portions each formed in an associated sliding recess, and wherein said actuator is formed with a plurality of sliding beams each extended downwardly from a bottom of the actuator and slidable in the sliding recess and blocked by the blocking portion.

11. The electrical connector as claimed in claim 10, wherein the actuator pushes the corresponding contacts outwardly during downward movement thereof.

12. The electrical connector as claimed in claim 10, wherein each of said protrusions forms a notch for facilitating loading/unloading the electronic component with regard to the electronic component receiving cavity.

* * * * *